United States Patent
Cheng et al.

(10) Patent No.: US 9,285,405 B2
(45) Date of Patent: Mar. 15, 2016

(54) THIN FILM SENSOR, CAPACITIVE TOUCH PANEL HAVING THE SAME AND PREPARATION METHOD THEREOF AND TERMINAL PRODUCT

(71) Applicant: SHENZHEN O-FILM TECH CO., LTD., Shenzhen, Guangdong (CN)

(72) Inventors: Zhizheng Cheng, Shenzhen (CN); Kai Meng, Shenzhen (CN); Genchu Tang, Shenzhen (CN)

(73) Assignee: Shenzhen O-Film Tech Co., Ltd., Shenzhen, Guangdong (CN)

( * ) Notice: Subject to any disclaimer, the term of this patent is extended or adjusted under 35 U.S.C. 154(b) by 31 days.

(21) Appl. No.: 14/000,178

(22) PCT Filed: Dec. 20, 2012

(86) PCT No.: PCT/CN2012/087084
§ 371 (c)(1),
(2) Date: Aug. 16, 2013

(87) PCT Pub. No.: WO2014/029184
PCT Pub. Date: Feb. 27, 2014

(65) Prior Publication Data
US 2014/0111708 A1    Apr. 24, 2014

(30) Foreign Application Priority Data

Aug. 24, 2012   (CN) .......................... 2012 1 0305729

(51) Int. Cl.
*G06F 3/045* (2006.01)
*G01R 27/26* (2006.01)
(Continued)

(52) U.S. Cl.
CPC .......... *G01R 27/2605* (2013.01); *G06F 1/1692* (2013.01); *G06F 3/044* (2013.01); *G06F 2203/04103* (2013.01); *Y10T 29/49105* (2015.01)

(58) Field of Classification Search
None
See application file for complete search history.

(56) References Cited

U.S. PATENT DOCUMENTS

| 4,765,729 A | 8/1988 | Taniguchi |
| 6,078,139 A | 6/2000 | Ochiai et al. |

(Continued)

FOREIGN PATENT DOCUMENTS

| CN | 2429326 Y | 5/2001 |
| CN | 1653561 A | 8/2005 |

(Continued)

OTHER PUBLICATIONS

Office Action in related JP patent application No. 2014-531099, dated Oct. 10, 2014; 4 pgs.

(Continued)

*Primary Examiner* — Joseph Haley
*Assistant Examiner* — Ifedayo Iluyomade
(74) *Attorney, Agent, or Firm* — Haynes Beffel & Wolfeld LLP; James F. Hann

(57) ABSTRACT

The present invention relates to a thin film sensor, capacitive touch panel having the sensor and preparation method thereof and terminal product. The thin film sensor of the present invention has only one optically conductive substrate. Specifically, only one optically transparent substrate is used, a sensing electrode layer and a driving electrode layer are coated on the upper and lower surfaces of the substrate, respectively, which helps to reduce the thickness of the thin film sensor on one hand, thus contributes to the development of light and thin of a touch panel and touch electronics; on the other hand, the material selection and the preparation process are simple, the selection of two substrates is not necessary to prepare two optically conductive thin film.

7 Claims, 3 Drawing Sheets

(51) Int. Cl.
*G06F 3/044* (2006.01)
*G06F 1/16* (2006.01)

(56) References Cited

U.S. PATENT DOCUMENTS

| | | | |
|---|---|---|---|
| 6,086,979 | A | 7/2000 | Kanbara et al. |
| 6,197,408 | B1 | 3/2001 | Kanbara et al. |
| 6,210,787 | B1 | 4/2001 | Goto et al. |
| 6,297,811 | B1 | 10/2001 | Kent et al. |
| 6,433,481 | B1 | 8/2002 | Marutsuka |
| 7,521,123 | B2 | 4/2009 | Hattori et al. |
| 7,920,129 | B2 | 4/2011 | Hotelling et al. |
| 7,931,518 | B2 | 4/2011 | Kotsubo et al. |
| 8,143,771 | B2 | 3/2012 | Shin et al. |
| 8,242,670 | B2 | 8/2012 | Kim et al. |
| 2004/0239650 | A1 | 12/2004 | Mackey |
| 2005/0170158 | A1 | 8/2005 | Hattori et al. |
| 2006/0141243 | A1 | 6/2006 | Ibuki |
| 2008/0062140 | A1 | 3/2008 | Hotelling et al. |
| 2009/0045163 | A1 | 2/2009 | Lambertini et al. |
| 2009/0219258 | A1 | 9/2009 | Geaghan et al. |
| 2010/0123670 | A1 | 5/2010 | Philipp |
| 2011/0019278 | A1 | 1/2011 | Aoki |
| 2011/0027577 | A1 | 2/2011 | Tanaka et al. |
| 2011/0032196 | A1 | 2/2011 | Feng et al. |
| 2011/0043465 | A1 | 2/2011 | Huang et al. |
| 2011/0050605 | A1 | 3/2011 | Pan et al. |
| 2011/0102370 | A1 | 5/2011 | Kono et al. |
| 2011/0109590 | A1* | 5/2011 | Park ............... G06F 3/0412 345/174 |
| 2011/0221704 | A1 | 9/2011 | Kurokawa et al. |
| 2011/0242019 | A1 | 10/2011 | Jeong et al. |
| 2011/0260741 | A1 | 10/2011 | Weaver et al. |
| 2011/0300908 | A1* | 12/2011 | Grespan ............ C03B 33/091 455/566 |
| 2012/0097424 | A1 | 4/2012 | Jo et al. |
| 2012/0199462 | A1 | 8/2012 | Hsu |
| 2012/0223049 | A1* | 9/2012 | Yoshikawa .......... C03C 27/10 216/36 |
| 2012/0319974 | A1 | 12/2012 | Kim et al. |
| 2012/0327569 | A1 | 12/2012 | Park et al. |
| 2013/0000959 | A1 | 1/2013 | Park et al. |
| 2013/0021289 | A1 | 1/2013 | Chen et al. |
| 2013/0050104 | A1 | 2/2013 | Lee et al. |
| 2013/0169548 | A1 | 7/2013 | Kim et al. |
| 2014/0070821 | A1* | 3/2014 | Cheng et al. ............ 324/658 |
| 2014/0111708 | A1 | 4/2014 | Cheng et al. |
| 2014/0216803 | A1 | 8/2014 | Cheng et al. |

FOREIGN PATENT DOCUMENTS

| | | | |
|---|---|---|---|
| CN | 101276079 | A | 10/2008 |
| CN | 101604634 | A | 12/2009 |
| CN | 101968697 | A | 2/2011 |
| CN | 101976146 | A | 2/2011 |
| CN | 102124427 | A | 7/2011 |
| CN | 102216891 | A | 10/2011 |
| CN | 102279682 | A | 12/2011 |
| JP | 2001091926 | A | 4/2001 |
| JP | 2007018226 | A | 1/2007 |
| JP | 2007319606 | A | 12/2007 |
| JP | 2008-083497 | A | 4/2008 |
| JP | 2008083491 | A | 4/2008 |
| JP | 2010039537 | A | 2/2010 |
| JP | 2011005793 | A | 1/2011 |
| JP | 2011044137 | A | 3/2011 |
| JP | 2011059772 | A | 3/2011 |
| JP | 2011096225 | A | 5/2011 |
| JP | 2011129527 | A | 6/2011 |
| JP | 2011211700 | A | 10/2011 |
| JP | 2012018634 | A | 1/2012 |
| JP | 3174557 | | 3/2012 |
| JP | 2012053644 | A | 3/2012 |
| JP | 2012108844 | A | 6/2012 |
| JP | 2012-133580 | A | 7/2012 |
| KR | 20100095988 | A | 9/2010 |
| KR | 20110051208 | A | 5/2011 |
| TW | 405011 | B | 9/2000 |
| TW | 408745 | U | 10/2000 |
| TW | 200945129 | A | 11/2009 |
| TW | 201115220 | A | 5/2011 |
| TW | M412413 | U | 9/2011 |
| TW | 201145125 | A | 12/2011 |
| TW | 201218056 | A | 5/2012 |
| TW | 201232632 | A | 8/2012 |
| TW | 201234243 | A | 8/2012 |
| WO | 2007008518 | A2 | 1/2007 |
| WO | 2011111748 | A1 | 9/2011 |

OTHER PUBLICATIONS

Office Action in related JP patent application No. 2014-531099, dated May 7, 2015; 4 pgs.
Office Action in related TW patent application No. 102130154, dated Apr. 8, 2015; 6 pgs.
Non-Final Office Action dated Mar. 20, 2015 for co-pending related U.S. Appl. No. 14/000,174, filed Aug. 16, 2013, 20 pgs.
KR Application No. 20147008151—Office Action dated Mar. 27, 2014, 4 pages.
PCT/CN2012/087082—International Search Report dated Apr. 4, 2013, 25 pages. (WO 2013/155852).
U.S. Appl. No. 14/000,163—Non Final Office Action dated Nov. 6, 2015, 13 pages.
KR Application No. 20147008156—Office Action dated Sep. 2, 2015, 5 pages.
PCT/CN2012/087083—International Search Report dated Jun. 6, 2013, 18 pages. (WO 2014/029183).
Office Action in corresponding TW Application No. 10420021250; dated Jan. 8, 2015; 6 pages.
Office Action in corresponding JP Application No. 2014-545089; dated Mar. 23, 2015; 3 pages.
Office Action in corresponding JP Application No. 2014-510653; dated Jul. 1, 2014; 5 pgs.
Office Action in corresponding JP Application No. 2014-510652; Sep. 1, 2014; 2 pages.
Office Action in related JP Application No. 2014-531098, dated Sep. 8, 2015; 4 pgs.
Office Action in related TW Application No. 102130153, dated Jul. 14, 2015; 5 pgs.
Office Action in corresponding CN Application No. 201210116164.1; dated Sep. 28, 2014; 4 pgs.
Office Action in corresponding JP Application No. 2014-510654; dated Sep. 30, 2014; 4 pgs.
Office Action in corresponding CN Application No. 201210116181.5; dated Mar. 16, 2015; 8 pgs.
U.S. Appl. No. 14/000,174—Non Final Office action dated Mar. 20, 2015, 20 pages.
U.S. Appl. No. 14/000,174—Final Office action dated Jul. 2, 2015, 22 pages.
U.S. Appl. No. 14/000,163—Non Final Office action dated Mar. 12, 2015, 15 pages.
U.S. Appl. No. 14/000,163—Final Office action dated Jul. 14, 2015, 16 pages.
U.S. Appl. No. 14/000,157—Non Final Office action dated Jul. 2, 2015, 39 pages.
U.S. Appl. No. 14/000,152—Non Final Office action dated Jan. 5, 2015, 10 pages.
U.S. Appl. No. 14/000,152—Final Office Action dated Apr. 9, 2015, 10 pages.
U.S. Appl. No. 14/000,157—Final Office Action dated Oct. 22, 2015, 25 pages.

* cited by examiner

THIN FILM SENSOR, CAPACITIVE TOUCH PANEL HAVING THE SAME AND PREPARATION METHOD THEREOF AND TERMINAL PRODUCT

FIELD OF THE INVENTION

The present invention relates to the thin film sensor, capacitive touch panel having the sensor and preparation method thereof and terminal product.

BACKGROUND OF THE INVENTION

Currently, the touch intelligent electronic devices are very popular in the market, the capacitive touch panel has been widely recognized due to its good Human-Machine interaction.

Generally speaking, capacitive touch panels can be divided into both the glass capacitive screen and thin film capacitive screen according to the substrate material of the sensor. The thin film capacitive touch panels are widely used in the smart phone, tablet computer and ultrabook due to that its sensor is lighter than the sensor of the glass capacitive touch panel, and the thin film material can be produced by the roll to roll manner which is conductive to mass production and enables lower production cost. The thin film capacitive touch panel has nearly the same size of market with the glass capacitive touch panel.

The sensor of the conventional thin film capacitive touch panel is made of two layers of conductive thin film which are jointed by optical glue. Specifically, first, the conductive thin film is fabricated, the electrode layers are fabricated on the upper surface of the two transparent thin film substrate respectively, two layers of conductive thin film are bonded by the optical glue then. The distance between the upper electrode layer and the lower electrode layer (the upper layer is the sensing electrode layer, the lower layer is the driving electrode layer) is equal to the thickness of a layer of thin film substrate pluses the thickness of a layer of optical glue, there is a layer of thin film substrate below the driving electrode layer.

The conventional thin film touch sensor is too thick, which would increase the thickness of the touch panel and do not contribute to the development of light and thin of the touch panel and touch electronics; and the raw materials are consumed more, the cost is high, the fabrication process is complicated.

SUMMARY OF THE INVENTION

It is an object of the present invention to provide a thinner thin film sensor and a thinner thin film capacitive touch panel.

In one aspect of the present invention, a thin film sensor used in the capacitive touch panel is provided, the thin film sensor comprises the sensing electrode layer and driving electrode layer, wherein the thin film sensor further comprises an optically transparent substrate, the substrate has two surfaces, the sensing electrode layer and the driving electrode layer are coated on the two surfaces respectively; the substrate is a single layer film.

The obtained thin film sensor used in the capacitive touch panel has only one optical conductive substrate, specifically, it has only one optically transparent substrate, two surfaces of the substrate are coated with the sensing electrode layer and driving electrode layer respectively, which, on one hand, helps to reduce the thickness of the thin film sensor, thus contributes to the development of light and thin of a touch panel and touch electronics; on the other hand, the material selection and the preparation process are very simple, the selection of two substrates is not necessary to prepare the two optically transparent thin films.

According to one embodiment, the substrate is a single layer PET film.

According to one embodiment, the thickness of the substrate is in the range of 0.05 to 0.2 mm.

According to one embodiment, the sensing electrode layer and the driving electrode layer are both made of optically transparent conductive material of ITO. The sensing electrode layer and the driving electrode layer are fabricated by coating a layer of conductive film of ITO on the surface of the thin film, the ITO film is then etched to form the ITO pattern which corresponds to the sensing electrode layer and the driving electrode layer respectively.

According to one embodiment, the sensing electrode layer and the driving electrode layer are both provided with metal electrode traces on surfaces thereof away from the substrate. Specifically, the sensing electrode layer and the driving electrode layer are coated on the thin film, surfaces of the sensing electrode layer and the driving electrode layer which are not coated with the thin film are coated with metal film, the metal film is etched to form metal electrode traces which correspond to the sensing electrode layer and the driving electrode layer respectively. The metal film can be Cu film, Al film, Ag film, or other metal film which is used in the sensing electrode layer of the capacitive touch panel and known to the person of the fild. The metal electrode can be Cu electrode, Al electrode or Ag electrode.

According to one embodiment, the sensing electrode layer and the driving electrode layer are electrically connected by a flexible printed circuit board. In a preferred embodiment, the sensing electrode layer is a circuit conducted along the direction of X-axis, the driving electrode layer is a circuit conducted along the direction of Y-axis. The flexible printed circuit board includes the first portion connected to the circuit conducted along the direction of the X-axis and the second portion connected to the circuit conducted along the direction of Y-axis. The first portion is electrically connected to the sensing electrode layer by the anisotropic conductive adhesive, the second portion is electrically connected to the driving electrode layer by the anisotropic conductive adhesive.

The present invention provides a capacitive touch panel in the other aspect, which includes the cover lens and the thin film sensor, the sensing electrode layer is closer to the cover lens compared to the driving electrode layer.

According to one embodiment, the sensing electrode layer of the thin film sensor and the cover lens are bonded by the optical glue.

According to one embodiment, the optical glue is an optical clear adhesive (OCA) with the thickness of 50 micrometers to 100 micrometers. In a preferred embodiment, the transmittance of the optical glue is more than 95%, which ensures the durability of the adhesive, the color and the sufficient display brightness.

According to one embodiment, the cover lens is made of an irregular shaped toughened glass; it can also be made of other glass used in the touch panel which is known to the skilled in the art.

According to one embodiment, the cover lens is provided with a window frame on a surface thereof, a surface of the window frame and the sensing electrode layer are bonded by optical glue.

The present invention provides a touch panel terminal product, which includes the capacitive touch panel.

The present invention also provides a preparation method of the capacitive touch panel, which includes the steps of the preparation of the thin film sensor, the steps of the preparation of the thin film sensor include:

the optically transparent electrode material is coated on two surfaces of the thin film substrate;

the electrode material located on one surface of the substrate is etched to form a sensing electrode pattern, the sensing electrode layer is prepared; the electrode material located on the other surface of the substrate is etched to form a driving electrode pattern, the driving electrode layer is prepared.

According to one embodiment, the optically transparent electrode material is coated on two surfaces of the thin film substrate by vacuum evaporation and magnetron sputtering.

According to one embodiment, the substrate is coated with ITO electrode material to form the conductive ITO film on two surfaces thereof, two conductive ITO films are coated with metal film on the surfaces thereof. An ITO pattern of the sensing electrode layer and an ITO pattern of the driving electrode layer located on two surfaces of the substrate, metal electrode traces 24 located on the surface of the sensing electrode layer 21, and metal electrode traces 25 located on the surface of the driving electrode layer are formed by a first double exposure developing etching. Part of the metal film is etched away to open the window by a second double exposure developing etching.

According to one embodiment, after the thin film sensor is fabricated, two functional parts of the printed circuit board are adhered to the sensing electrode layer and driving electrode layer of the thin film sensor by an anisotropic conductive glue (also known as the anisotropic conductive film). Specifically, the sensing electrode layer is a circuit conducted along the direction of X-axis, the driving electrode layer is a circuit conducted along the direction of Y-axis. The flexible printed circuit board includes the first portion connected to the circuit conducted along the direction of the X-axis, and the second portion connected to the circuit conducted along the direction of Y-axis. Wherein the first portion is electrically connected to the sensing electrode layer by the anisotropic conductive adhesive, the second portion is electrically connected to the driving electrode layer by the anisotropic conductive adhesive.

According to one embodiment, the window frame is fabricated on a surface of the cover lens by screen printing, a surface of the cover lens having the window frame and the sensing electrode layer of the thin film sensor are bonded by optical glue.

DETAILED DESCRIPTION OF THE EMBODIMENTS

Figure 6:
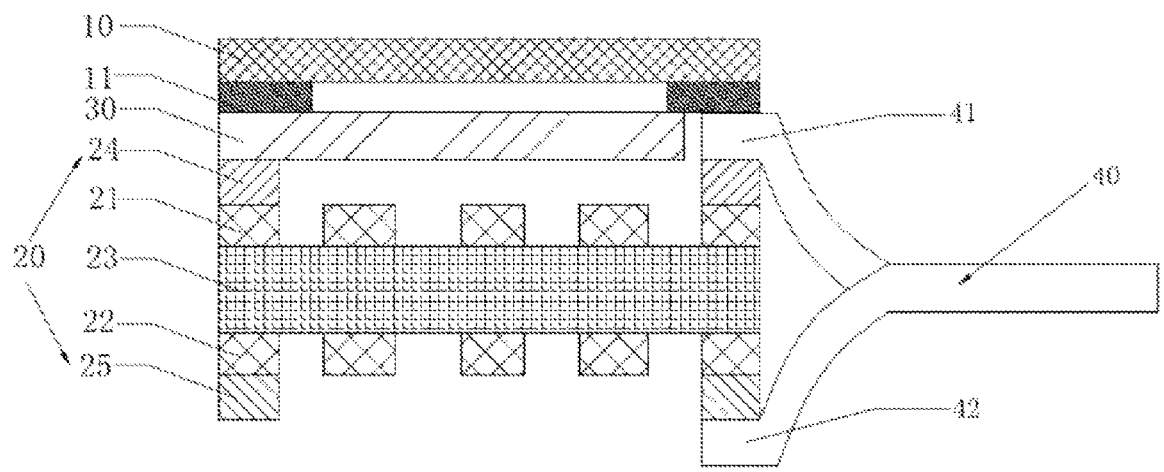
FIG. 6 is a cross-section view of the of the capacitive touch panel in accordance with the first embodiment.

FIG. 6 is a cross-section view of the capacitive touch panel in accordance with the first embodiment; the capacitive touch panel includes a cover lens 10 and a thin film sensor 20.

The cover lens 10 is made of an irregular shaped toughened glass.

The cover lens 10 is provided with a window frame 11 on a lower surface (a surface which is bonded to the thin film sensor) thereof, generally speaking, the window frame 11 is set on the cover lens 10 by screen printing technique with all kinds of colour inks The thin film sensor 20 includes a sensing electrode layer 21, a driving electrode layer 22, and a substrate 23.

The substrate 23 is a single layer PET film, which is substantially optically transparent.

The substrate 23 has an upper surface and a lower surface, the sensing electrode layer 21 and the driving electrode layer 22 are coated on the upper and lower surfaces, respectively, the sensing electrode layer 21 is closer to the cover lens 10 compared to the driving electrode layer 22.

The sensing electrode layer 21 and the driving electrode layer 22 are both made of optically transparent conductive material of ITO. The sensing electrode layer 21 and the driving electrode layer 22 are prepared by coating an ITO conductive film on surfaces of the substrate 23, and etching to form the needed ITO pattern.

The sensing electrode layer 21 is provided with metal electrode traces 24 on a surface thereof away from the substrate 23. The driving electrode layer 22 is provided with metal electrode traces 25 on a surface thereof away from the substrate 23. Specifically, the electrode layer is coated with a metal film on a surface thereof, the metal film is etched to form the metal electrode traces. The metal film can be Cu film, Al film, Ag film, or other film which can be used as the metal film of the sensing electrode layer of the capacitive touch panel, and is known to the skilled of the filed. Correspondingly, the metal electrode traces can be Cu traces, Al traces, and Ag traces.

A surface of the cover lens 10 with the window frame 11 and the thin film sensor 20 (on a surface with the sensing electrode layer 21) are bonded by an OCA 30.

The flexible printing circuit board is bonded to an end of the thin film sensor 20. The first metal electrode traces 24 of the sensing electrode layer 21 and the second metal electrode traces 25 of the driving electrode layer 22 are electrically connected by a printed circuit board 40.

Figure 1:
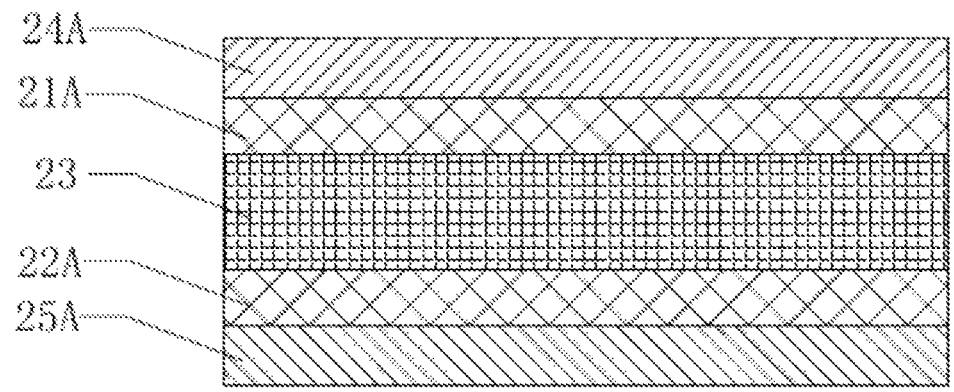
FIG. 1 is a cross-section view of the first step of the preparation method of the capacitive touch panel in accordance with a first embodiment.

A preparation method of a capacitive touch panel according to the first embodiment includes the following steps:

Step one, referring to FIG. 1, the substrate 23 is selected, which is a single layer PET film. ITO conductive films are coated on the upper and lower surfaces of the substrate 23, an ITO conductive film 21A of the sensing electrode layer 21 is coated on the upper surface, an ITO conductive film 22A of the driving electrode layer 22A is coated on the lower surface; a metal film 24A and a metal film 25A are coated on surfaces of the two ITO conductive film respectively then.

Figure 2:
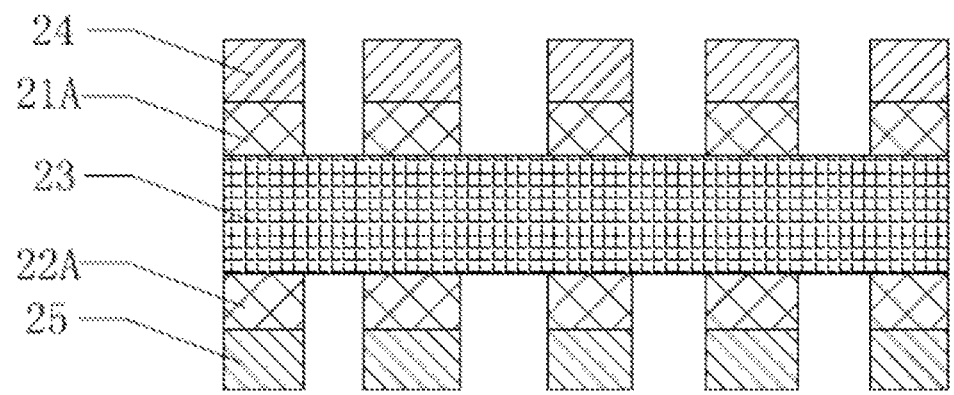
FIG. 2 is a cross-section view of the second step of the preparation method of the capacitive touch panel in accordance with the first embodiment.
Figure 3:
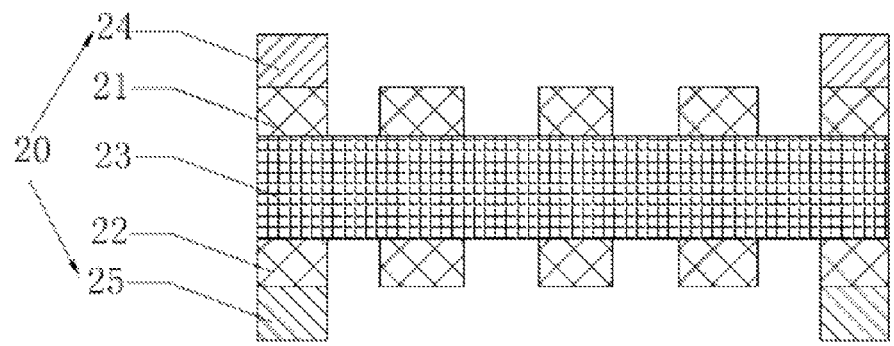
FIG. 3 is a cross-section view of the third step of the preparation method of the capacitive touch panel in accordance with the first embodiment.

Step two, referring to FIG. 2, the sensing electrode layer 21 (a sensing electrode layer ITO pattern) and the driving electrode layer 22 (a driving electrode layer pattern) and the metal electrode traces 24 located on the surface of the sensing electrode layer 21 and the metal electrode traces 25 located on the surface of the driving electrode layer 22 are formed on two surfaces of the substrate 23 by a first double exposure developing etching;

Step three, referring to FIG. 3, part of the metal film is etched away to open the window by a second double exposure developing etching.

The thin film sensor 20 is prepared in the above three steps.

Figure 4:
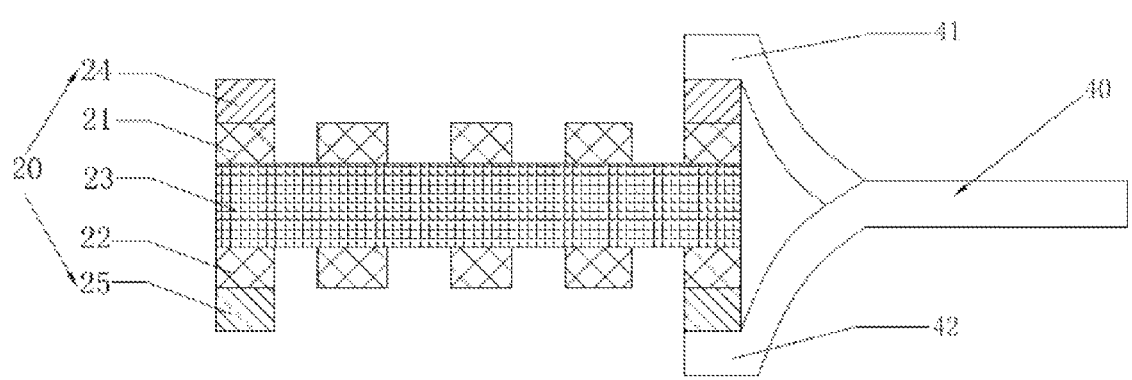
FIG. 4 is a cross-section view of the fourth step of the preparation method of the capacitive touch panel in accordance with the first embodiment.

Step four, referring to FIG. 4, the flexible printed circuit board 40 and an end of the thin film sensor 20 are bonded by an anisotropic conductive glue.

Assume that the sensing electrode layer 21 is a circuit conducted along the direction of X-axis, the driving electrode layer 22 is a circuit conducted along the direction of Y-axis. The flexible printed circuit board 40 includes a first portion 41 connected to the circuit conducted along the direction of the X-axis, and a second portion 42 connected to the circuit conducted along the direction of Y-axis. The first portion 41 is electrically connected to the sensing electrode layer 21 by the anisotropic conductive adhesive, the second portion 42 is electrically connected to the driving electrode layer 22 by the anisotropic conductive adhesive.

Figure 5:
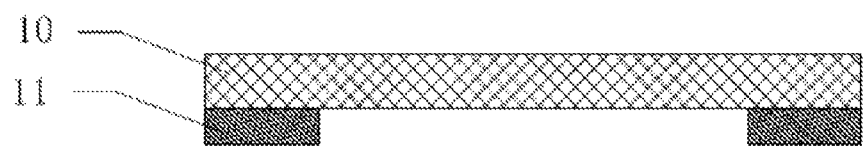
FIG. 5 is a cross-section view of the fifth step of the preparation method of the capacitive touch panel in accordance with the first embodiment.

Step five, referring to FIG. 5, the cover lens 10 is selected, the window frame 11 is fabricated on a surface of the cover lens 10 by screen printing and using the ink;

Step six, referring to FIG. 6, a surface of the cover lens which is provided with the window frame 11 thereon and a surface of the thin film sensor 20 (on a surface with the sensing electrodeelayer 21) are bonded by the OCA 30.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A preparation method for a capacitive touch panel, the capacitive touch panel comprising: a cover lens provided with a window frame on a surface thereof; the window frame being fabricated on a surface of the cover lens by screen printing; a thin film sensor comprising a sensing electrode layer, and a driving electrode layer, and an optically transparent substrate; a surface of the cover lens having the window frame being bonded to the sensing electrode layer of the thin film sensor by optical glue; the substrate having two surfaces, the sensing electrode layer and the driving electrode layer being coated on the two surfaces, respectively; the substrate being a single layer film; and the sensing electrode layer being closer to the cover lens compared to the driving electrode layer; the method comprising preparing the thin film sensor by: coating two surfaces of the substrate with an optically transparent electrode material; etching the electrode material located on one surface of the substrate to form a sensing electrode pattern; etching the electrode material located on the other surface of the substrate to form a driving electrode pattern; and preparing the sensing electrode layer and the driving electrode layer by coating said two surfaces of the substrate with an ITO conductive film; bonding a first portion of a printed circuit board to the thin film sensor above the sensing electrode pattern using an anisotropic conductive adhesive; and bonding a second portion of the printed circuit board to the thin film sensor below the driving electrode pattern using an anisotropic conductive adhesive.

2. The method according to claim 1, wherein the substrate is a single layer PET film.

3. The method according to claim 1, wherein the thickness of the substrate is in the range of 0.05 to 0.2 mm.

4. The method according to claim 1, wherein the sensing electrode layer and the driving electrode layer are both provided with metal electrode traces on surfaces thereof away from the substrate.

5. The method according to claim 1, wherein the surface having the window frame and the sensing electrode layer are bonded by optical glue.

6. The method according to claim 1, wherein the optically transparent electrode material is coated on two surfaces of the thin film substrate by vacuum evaporation and magnetron sputtering.

7. The method according to claim 1, wherein the bonding steps are carried out by:
bonding the first portion of the printed circuit board directly to a first metal electrode trace using the anisotropic conductive adhesive, the first metal electrode trace being located between the first portion of the printed circuit board and the sensing electrode pattern; and
bonding the second portion of the printed circuit board directly to a second metal electrode trace using the anisotropic conductive adhesive, the second metal electrode trace being located between the second portion of the printed circuit board and the driving electrode pattern.

* * * * *